United States Patent [19]

Gerry

[11] Patent Number: 4,558,392

[45] Date of Patent: Dec. 10, 1985

[54] RESISTIVE-CAPACITIVE IGNITION TRANSMISSION CABLE

[76] Inventor: Martin E. Gerry, 13452 Winthrope St., Santa Ana, Calif. 92705

[21] Appl. No.: 647,166

[22] Filed: Sep. 4, 1984

[51] Int. Cl.[4] .......................... F23Q 3/00; H03H 7/01

[52] U.S. Cl. ....................................... 361/253; 333/12; 174/32; 174/36

[58] Field of Search .................... 361/253; 315/209 R; 333/12; 174/32, 34, 36

[56] References Cited

U.S. PATENT DOCUMENTS

| | | | |
|---|---|---|---|
| 3,492,622 | 1/1970 | Hayashi et al. | 174/36 UX |
| 4,413,304 | 11/1983 | Gerry | 361/253 X |
| 4,422,054 | 12/1983 | Gerry | 333/12 |
| 4,451,764 | 5/1984 | Gerry | 315/209 R |

*Primary Examiner*—Donald A. Griffin

[57] ABSTRACT

A transmission cable (30, 50, 70, 80) for an ignition system of a fuel burning engine has a body of electrical insulation (31, 51, 71, 81). The cable has embedded in its insulation either a distributed or lumped parameter capacitive element (32–35, 52–55, 72–75, 82–84) connected in parallel with either a distributed or lumped parameter resistive element (36–38, 56–58, 76, 86–88) which coact to increase the energy delivered to an igniter and hence to a fuel nodule. The parameter values of the capacitive and resistive elements are such as to produce first order poles with only real parts in the complex plane defining the ignition current. Other parameter values are usable where such values limit the peak ignition voltage level drop in the cable to less than 20,000 volts. A feature of this cable is that the capacitive element is structured to produce electric and magnetic field components that cancel each other, thereby also reducing radio noise induction.

30 Claims, 20 Drawing Figures

RESISTIVE-CAPACITIVE IGNITION TRANSMISSION CABLE

TECHNICAL FIELD

This invention is in the field of high voltage ignition cables for an ignition system of a fuel burning engine.

BACKGROUND ART

There is no known background art embodying the capacitive and resistive parallel parameter characteristics in a high voltage ignition transmission cable.

U.S. Pat. Nos. 4,451,764, 4,422,054 and 4,413,304 to same applicant features distributed capacitive parameter cables without resistive parallel components to inhibit high destructive voltages from appearing across the capacitive element.

DISCLOSURE OF INVENTION

It is an objective of this invention to provide a transmission cable for transferring high transient currents fed by an ignition transformer secondary winding to an igniter without producing a destructively high voltage across such cable.

It is another objective of this invention to provide high ignition currents and relatively low voltage drops across the transmission cable, wherein the cable would have such properties that cause cancellation of radiated electric and magnetic fields so as to minimize radio noise induction.

It is still another objective of this invention to increase the energy level fed to an igniter of a fuel burning engine via a transmission cable by virtue of the transmission cable parameters per se.

Accordingly, a high voltage ignition transmission cable is provided with resistive and capacitive parameters in parallel. Such capacitive parameters are either distributed or lumped, and such resistive parameters are also either distributed or lumped. When the resistive parameters are distributed a relatively thin and high resistance wire, a fiber saturated with carbon or the like material or the electrical insulation in which the capacitor is embedded is itself resistive or semi-conductive, may be used. When a lumped parameter resistor is used, it may be situated anywhere along the cable length and connected by means of electrical conductor wires in parallel with the capacitor. When the capacitive parameter is lumped, it may also be connected in parallel with the resistor by means of leads running the length of the cable. When both the capacitive and resistive parameters are lumped and connected in parallel, such configuration may also be used as an adapter coupled either between the ignition transformer secondary winding and a conventional igniter cable or between a conventional ignition cable and the igniter input terminal.

The parallel distributed parameter structures of the transmission cable maintain high current conduction but minimum electric and magnetic field radiation and provide high energy to an igniter while minimizing radio interference.

BEST MODE FOR CARRYING OUT THE INVENTION

Structural and Functional Aspects of the Invention

Referring to FIGS. 1 through 9 in general, it will be shown in the theoretical considerations, that the transmission cables will effect an igniter current increase and consequently an increased fuel nodule in mass and volume at the arc gap of igniter W, with attendant electrical energy content of the generated electrical arc, thereby increasing the engine efficiency, increasing fuel usage efficiency and decreasing fuel consumption. Einstein's equation for energy, mass and velocity relationships leads to the equation applicable herein:

$$\epsilon = mv^2 \quad (1)$$

where $\epsilon$ is the energy in watt-seconds, m is the mass or volume of the fuel nodule, and v is the velocity of the particles constituting the electric arc.

With these transmission cables the fuel nodule will increase by a factor of 4 over the conventional fuel nodule in terms of mass or volume, and considering the current flow increase as shown in the computations below more than doubling the arc velocity, the fuel nodule will contain about 9.2 times the energy level as compared to the conventional fuel nodule, constituting a 920% energy increase.

Figure 1:
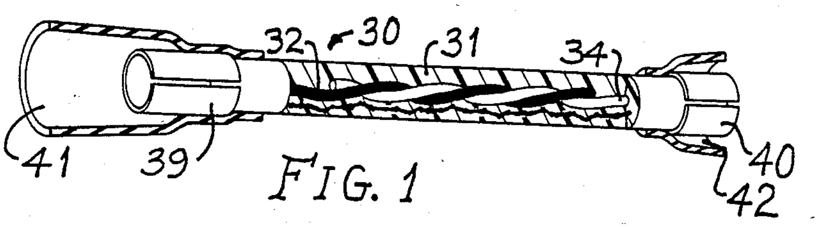
FIG. 1 is a perspective view, partially in cross section, of the ignition transmission cable in accordance with the invention.
Figure 2:
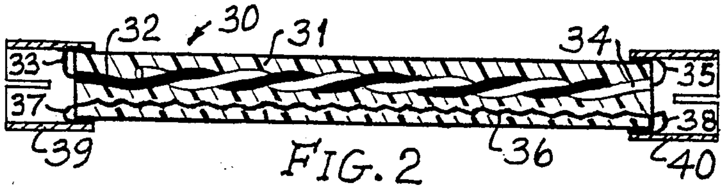
FIG. 2 is a cross section view along the length of the cable of FIG. 1, but without the end rubber retainer boots thereon, to show the structure of the distributed capacity and resistance parameters of the cable.
Figure 4:
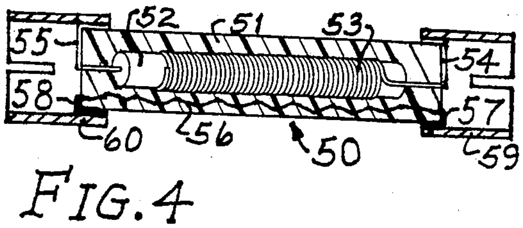
FIG. 4 is a cross section view, partially in perspective, of another version of the distributed parameter capacitance in parallel with a resistive parameter component comprising the transmission cable.
Figure 6:
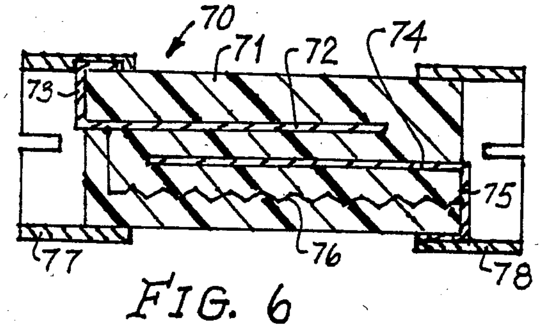
FIG. 6 is a cross section view of still another version of a distributed parameter transmission cable.
Figure 8:
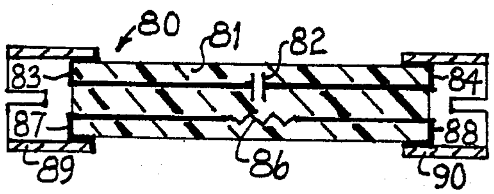
FIG. 8 is a cross section view of still another variation of the ignition transmission cable wherein the parameters thereof are lumped, and wherein such structure may be utilized as an ignition circuit adapter.
Figure 9:
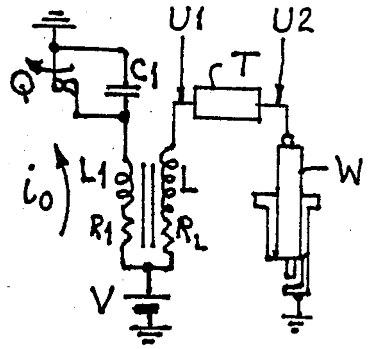
FIG. 9 is a circuit schematic of an ignition system employing the ignition current transmission cable. Such schematic will be used to illustate ignition voltage potentials, initial charge conditions of the ignition transformer primary winding, voltage induced in the ignition transformer primary winding and voltage induced in the ignition transformer secondary winding constituting the forcing function to which the ignition current transmission cable is subjected.

It should be noted that although FIG. 9 shows ignition transmission cable T symbolically, cable T therein and in this specification is intended to represent cable 30 of FIGS. 1 and 2, cable 50 of FIG. 4, cable 70 of FIG. 6 and cable 80 of FIG. 8.

Figure 10:
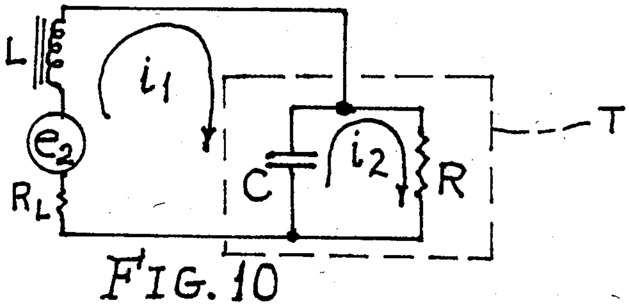
FIG. 10 is an equivalent circuit of the secondary winding of the ignition transformer shown in FIG. 9 with its induced voltage feeding the ignition current transmission cable that is coupled to the igniter, which igniter is not required for this equivalent circuit. Such equivalent circuit will be the basis for performance computations of the transmission cable in models having different capacitive and resistive parameters.

With respect to FIGS. 9 and 10, a peak value of ignition voltage $e_2$ of $29 \times 10^3$ volts is induced in ignition transformer secondary winding L. Voltage $e_2$ is applied to cable T at U1 and at U2 at initiation of ignition by timer Q being placed in open state condition and prior to the time current starts to flow. Hence the question arises up to why capacitor C within cable T does not break down in view of the peak potential of $e_2$.

Bearing in mind that current flow through igniter W is delayed somewhat, the voltage leading the current in a dominating inductive circuit, and that no arc occurs across the gap until current begins to flow, the potential at U2 is the same as the potential at U1, and hence no potential difference is present across capacitor C of cable T. Such condition may be stated as:

$$e_{2U1} - e_{2U2} = 0 \quad (2)$$

and capacitor C is not subjected to any ignition voltage.

When current begins to flow, there will be a relatively low potential difference across capacitor C in any of the RC combinations that meet the criteria developed below, so that a capacitor of suitable value and physical size is realizable within the confines of cable T.

Figure 3:
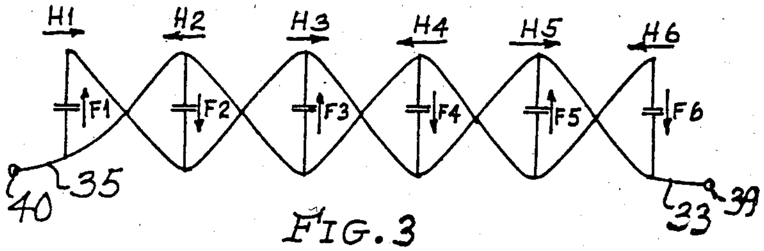
FIG. 3 is an electric and magnetic field schematic of the field components contributed by FIGS. 1 and 2 structure to show cancellation of radiated fields.

Referring to FIGS. 1, 2 and 3, one form of distributed parameter cable T, shown symbolically in FIGS. 9 and 10, is illustrated at 30. Cable 30 takes advantage of the principle of distributed capacity between a pair of twisted or transposed wires in segmentary portions, effecting ignition current conduction through the distributed capacities inherent in cable 30.

A conventional electrical insulation body 31 has twisted pair of wires embedded therein. For ease of understanding, one wire is shown with a black color electrical insulation 32 encasing wire 33 which extends from and is bent over one end of insulation 31 for making electrical connection with connector 39 crimped to the outer surface of insulation 31. Another wire shown with a white insulation 34 encasing wire 35 which extends from and is bent over the other end of insulation 31 for making electrical connection with connector 40 is crimped by connector 40 on to the outer surface of insulation 31. Opposite ends of wires in black and white insulation which are opposite their ends connected to connectors 39 and 40, are within their respective black and white casings and are not connected to anything. Thus the twisted pair of wires acts as a capacitor, symbolically shown in FIG. 10 as capacitor C. Additionally, resistor 36 also embedded in insulation 31 is connected at one of its ends 37 to connector 39 being crimped between the connector and the outer surface of insulation 31. Resistor 36 is connected at its other end 38 to connector 40 being crimped between the connector and the outer surface of insulation 31. Thus, resistor 36, symbolically shown in FIG. 10 as resistor R, is electrically in parallel with the distributed capacitor. Cable 30 is shown in FIG. 1 with conventional rubber boots 41 and 42 at its ends for retaining the cable securely within ports of ignition system components to which such cable is connected.

It should be noted that resistor 36 may constitute a distributed parameter resistor or very thin strand, a lumped parameter resistor such as resistor 86 in FIG. 8, or a distributed parameter resistor made of a fiber saturated or coated with resistance material such as carbon or the like.

The electrical equivalent circuit of cable 30 is shown in terms of FIG. 3, showing wires 33 and 35 and their respective terminations at connectors 39 and 40, wherein the wires have a number of transposed segments. Each of the segments of the wire pair is illustratively expanded so that the electro-magnetic field components can be ascertained and illustrated.

Assuming at one instant of time that termination at 40 of wire 35 is at a positive potential and the termination at 39 of wire 33 is at a negative potential with respect to the potential at 40 due to ignition current flow of displacement current components in the same direction as created by their respective electric field components F1, F2, F3, F4, F5 and F6, it can be seen that cable 30 as structured acts as a distributed capacitor with a theoretically infinite number of capacitive elements traversing the length of the transposed wire pair.

As an example, since electric field vector F1 will be established in a direction from the positively charged wire 35 to the negatively charged wire 33, electric field vector F2 will also be established in a direction from its positively charged wire to its negatively charged wire, but due to transposition of the wires within the wire segment electric field vector F2 will be in a direction opposite to electric field vector F1. Hence current components will be displaced in opposing directions per segment but in the same direction as their respective electric field vectors. Consequently, although the electric field vectors will change in direction with every transposition segment, and thereby effect electric field cancellation, the displacment currents will pass between the wire pair in similar manner as displacement current transfers between plates of a capacitor in a manner documented by Maxwell's equations. It is well known that ignition current is a complex transient current which a capacitor will readily pass.

Applying the right hand rule of current and magnetic field directions, it can be seen from the diagram that magnetic field vector component H1 will be perpendicular to electric field vector component F1, and that magnetic field vector component H2 will be perpendicular to electric field vector component F2. Since the electric field component F1 is in opposite direction to the electric field component F2, the direction of magnetic field vector component H1 will be opposite to the direction of magnetic field vector component H2 and of equal magnitude as H1, thus cancelling each other and precluding induction of such field into the radio receiver. In similar manner H3 will be cancelled by H4 and H5 will be cancelled by H6. It is pointed out that the magnetic fields were simply illustrated in a single plane whereas in actuality such fields are circumferential to the structure of the transposed wire pair with field components that cancel each other everywhere along the length of cable 30.

The current through resistor 36 will be attenuated by virtue of its resistive value and hence magnetic and electric fields due to resistor current flow will be extremely small and by itself ineffective as a radio interference source. However the principal feature of the cable is the coaction of the capacitive and resistive parameters to limit the voltage stress across the cable, also provides a greater current transfer without any substantial radiation therefrom. Such coaction will be discussed in the theoretical considerations portion below, for various models employing different R and C combinations.

Figure 5:
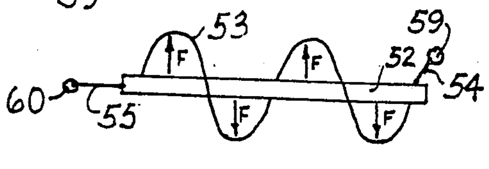
FIG. 5 is a graphical representation of ignition current flow and electric field components by the cable structure of FIG. 4.

Referring to FIGS. 4 and 5, cable 50 comprises a distributed inductive-capacitive element 52 and 53 and 54 and 55, incorporating a substantially coaxial structure having a central core at 55 which is electrically insulated from winding 53. Winding 53 is terminated at 59 by means of end 54 thereof being in contact with connector 59, and central core 55 is terminated at connector 60 by making contact therewith. Connectors 59 and 60 are crimped to electrical insulation 51 in which the distributed capacity element is embedded. Insulation 51 may be synthetic resin polymer or any other electrical insulation material.

Core 55 may be metallic or a semiconductor material with an electrically insulating material 52 surrounding the metallic or semiconductor core. The end of winding 53, opposite to winding termination at 59, is unconnected. The end of core member 55 opposite to its termination at 60 is also unconnected and is within the confines of core insulation 52.

Resistor 56 is also embedded within insulation 51 and connected in parallel with the distributed capacitor by virtue of ends 57 and 58 thereof being respectively in cooperation with connectors 59 and 60.

It may be seen from the equivalent electric field illustration of FIG. 5, that winding 53 has distributed inductance, a specific value of inductance for each turn of such winding. It may also be appreciated that the distributed capacities thereof are inherent by virtue of its construction and proximities of winding 53 turns to core 55. The distributed capacities will appear between each turn of winding 53 and central core 55.

The distributed capacities formed between each turn of winding 53 and core 55 effect conductive transfer of ignition current via these distributed capacities in similar manner as discussed in conjunction with the structure at 30. However, this structure possesses the ability to effect cancellation of the electric field vector components only during displacement current transfer through the distributed capacities.

Figure 7:
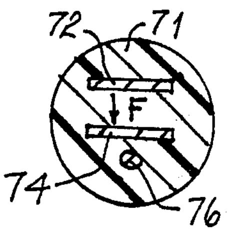
FIG. 7 is a transverse cross section view of the cable of FIG. 6 to show the electric field within such cable.

Referring to FIGS. 6 and 7, cable 70 has distributed capacity between a pair of parallel elongated electrical conductors 72 and 74, spaced from each other by means of electrical insulation 71 which also surrounds resistor 76.

Conductors 72 and 74 are terminated at opposite ends of cable 70 by means of ends 73 and 75 being respectively connected to connectors 77 and 78 which crimp about ends 73 and 75 holding such ends to the outer surface of insulation 71. The ends of resistor 76 are connected in parallel with distributed capacity elements 72 and 74.

Cable 70 provides displacement current transfer between its elements 72 and 74 of alternating current nature along the direction of electric field vector F, shown in FIG. 7.

Referring to FIG. 8, cable 80 hereof is comprised of lumped parameters. Lumped parameter capacitor 82 and lumped parameter resistor 86 are both encased within electrical insulation 81. Capacitor 82 has leads 83 and 84 respectively terminating at and making contact with connectors 89 and 90. Similarly, resistor 86 has leads 87 and 88 also respectively making contact with connectors 89 and 90, thereby placing capacitor 82 and resistor 86 in a parallel connective structure. This lumped parameter cable does not have any substantial electric and magnetic field cancellation properties that are attributable to its capacitive element, but may be utilized as an adapter between a conventional ignition transformer secondary winding output and the input to a conventional ignition cable, between a distributor and an igniter or between an ignition cable and an igniter.

It should be noted that cables 30, 50, 70 or 80 shown in the illustration figures, have connectors that are used for making electrical connection to other ignition components of an ignition system.

Theoretical Considerations and Computational Aspects of Invention

Figure 17:
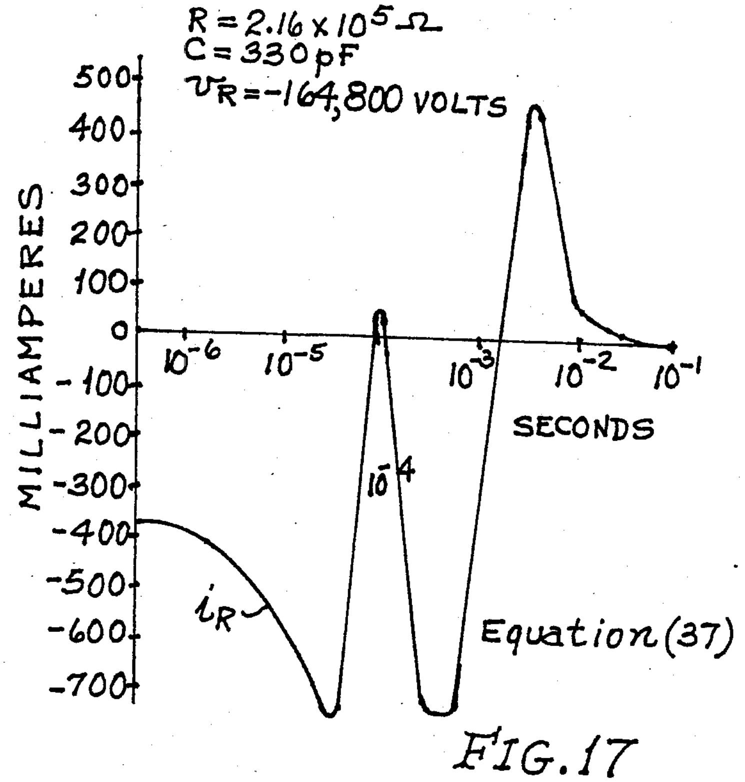
FIG. 17 is a time function graph of the computed currents through the resistor and through the capacitor within the cable, wherein the resistor is valued at $2.16\times10^5$ ohms and the capacitor is valued at 330 picofarads.
Figure 18:
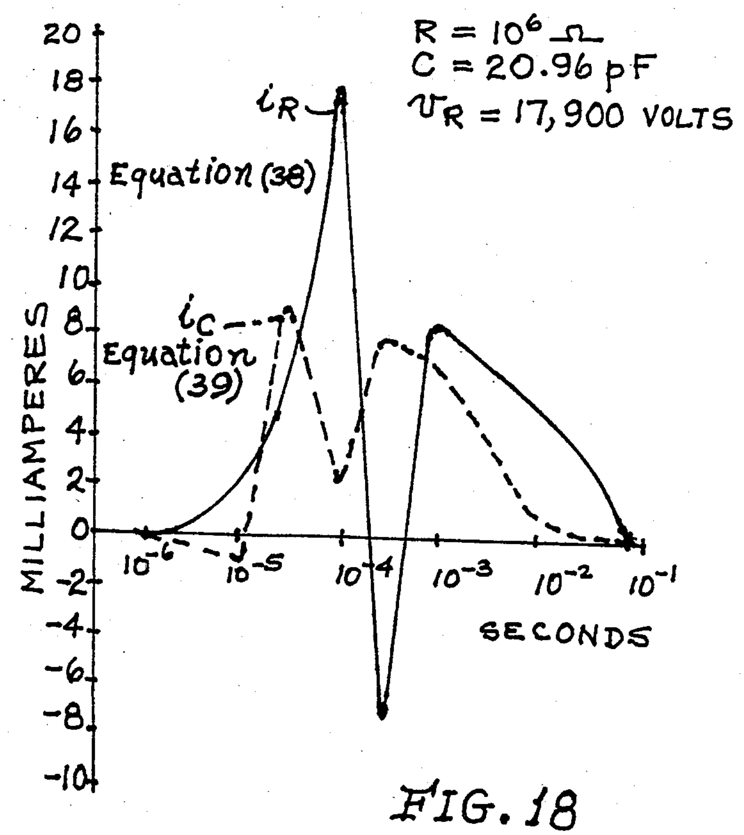
FIG. 18 is a time function graph of the computed currents through the resistor and through the capacitor within the cable, wherein the resistor is valued at $10^6$ ohms and the capacitor is valued at 20.96 picofarads.
Figure 19:
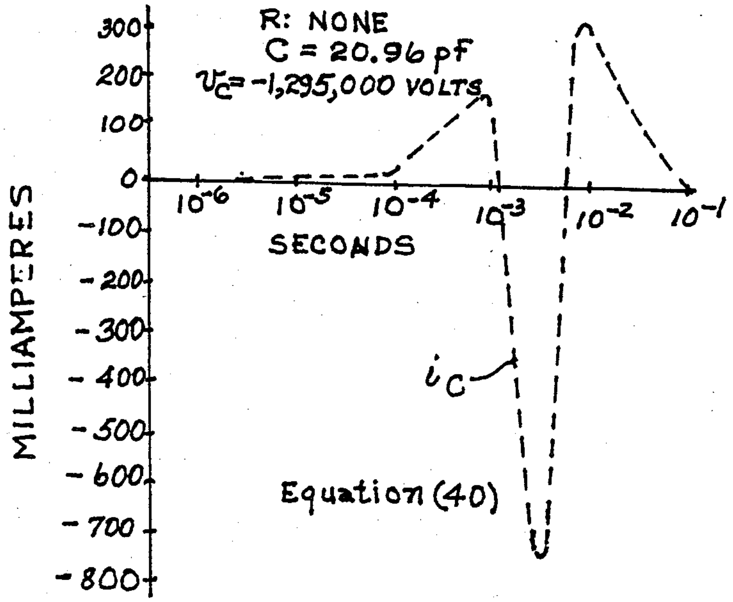
FIG. 19 is a time function graph of the computed current through the capacitor within the cable, wherein the capacitor is 20.96 picofarads. No resistor is utilized in this computational model.
Figure 20:
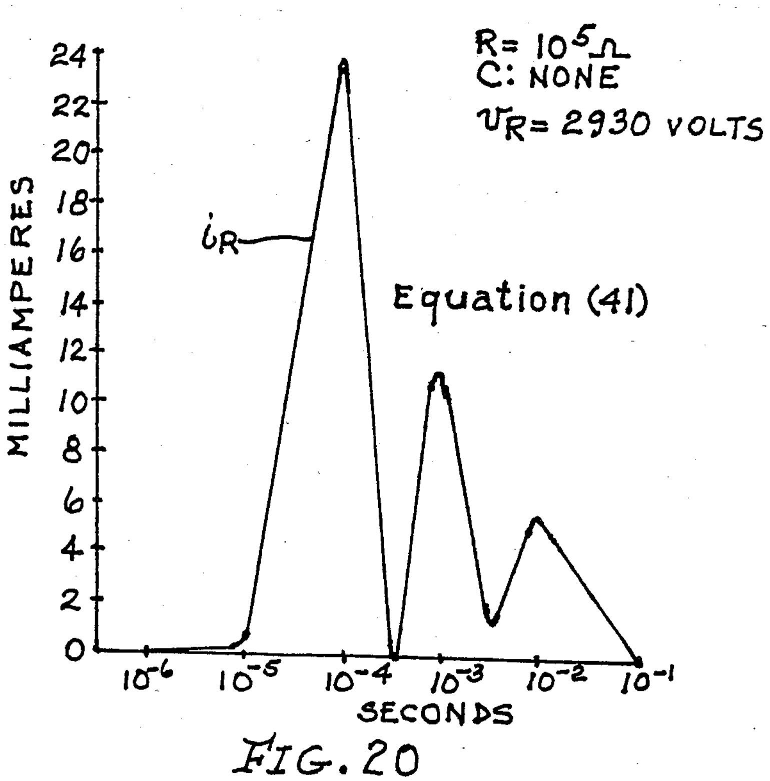
FIG. 20 is a time function graph of the computed current through the resistor within the cable, wherein the resistor is valued at $10^5$ ohms. No capacitor is utilized in this computational model.

FIGS. 9 through 20 and their discussion, represent the theoretical development for the specific structures of FIGS. 1, 2, 4, 6 and 8. Whether distributed or lumped parameter capacitor C is used, and whether lumped or distributed parameter resistor R is used in parallel with C, such parameters are defined by the terms R and C in the theoretical development that follows. Computations dealing with a capacitor only within the cable's insulation are treated in connection with FIG. 19 illustration for a specific value of capacitor. Computations dealing with a resistor only within the cable's insulation are treated in conjunction with FIG. 20 illustration.

The mathematical treatment that follows involves solution of integro-differential equations based on the model of FIG. 10 as well as the determination of initial conditions and induced primary and secondary voltages of the ignition transformer based on the circuit of FIG. 9. The integro-defferential equations are converted into Laplace transformed equations, thereby converting from the time domain to the complex or frequency domain. The Laplace transformed solutions are then reconverted back from the complex domain to the time domain by an inverse Laplace transformation so that the graphed solutions are in the time domain.

Referring to FIGS. 9 and 10, the cable is symbolically indicated at T. The circuits in these figures use symbols since symbols are more expedient in developing the various equations, as opposed to using numerals, in the transient analyses that follows, yielding performance characteristics graphically depicted in FIGS. 11 through 20. The symbolic parameters will have values as stated in the following table.

TABLE 1

| Symbolic Parameter | Definition | Value |
|---|---|---|
| Q | ignition timer switch | open or closed |
| V | D.C. power source | 12 volts |
| $L_1$ | primary winding inductance of ignition transformer | $6.7 \times 10^{-3}$ henries |
| $R_1$ | series resistance of $L_1$ | 1.4 ohms |
| $C_1$ | capacitor in primary winding circuit of ignition transformer | $0.2 \times 10^{-6}$ farads |
| L | secondary winding inductance of ignition transformer | 64 henries |
| $R_L$ | series resistance of L | $8 \times 10^3$ ohms |
| $e_2$ | open circuit voltage of L | varies as a function of time |
| k | coefficient of $i_p$ ($i_p$ defined in Table 2) | 1.62 amperes |
| K | coefficient of $e_2$ | $29 \times 10^3$ volts |
| a | attentuation coefficient of exponential term of $e_2$ | $1.045 \times 10^2$ |
| $\beta$ | the frequency of the trigonometric term in $e_2$ | $2.73 \times 10^4$ radians/sec. |
| R | resistor within cable | values change in each example |
| C | capacitor within cable | values change in each example |

The symbolic parameters in the following table are variables and do not have discrete values.

TABLE 2

| Symbolic Parameter | Definition |
|---|---|
| s | a complex number used to represent a Laplace transformed function from the time domain to to the complex or frequency domain |
| $i_o$ | charging current of $L_1$ as a function of time t |
| $i_p$ | primary winding current as a function of time t with secondary winding of ignition transformer open-circuited |
| $i_1$ | loop current in circuit of FIG. 10 |
| $i_2$ | loop current in circuit of FIG. 10 |
| $I_1$ | Laplace transform of $i_1$ |
| $I_2$ | Laplace transform of $i_2$ |
| $I_R$ | the Laplace transform of the current through resistor R, equal to $I_2$ |
| $I_C$ | the Laplace transform of the current through capacitor C, equal to $I_1$-$I_2$ |
| $i_R$ | current through resistor R, as a function of t |
| $i_C$ | current through capacitor C, as a funtion of t |
| t | the time variable, in seconds |

Referring to FIG. 9, the charge in primary winding $L_1$ of the ignition transformer is obtained when timer Q is placed in its closed state, short circuiting capacitor $C_1$ and charging primary $L_1$ with current $i_o$, which when evaluated at time $t=10^{-3}$ seconds, represents the typical average charging time for the various ignition transformers feeding igniters of automotive systems. The Laplace transform for current $i_o$ is:

$$I_o = \frac{V}{L_1 s\left(s + \frac{R_1}{L_1}\right)} \quad (3)$$

which when evaluated by the Residue Theorem for the residues at the poles of (3) provides the equation for the charging current as a function of time. Hence, $$i_o = \frac{V}{R_1}\left(1 - e^{-\frac{R_1}{L_1}t}\right) \quad (4)$$

and when evaluated at $t=10^{-3}$ seconds, $i_o=1.62$ amperes.

The primary winding current $i_p$ due to charge voltage $L_1 i_o$ is derived by solving the primary circuit equation including capacitor $C_1$, with the secondary circuit of the ignition transformer in open circuit condition, achieved when switch Q is placed in its open state. The Laplace transform $i_p$ becomes:

$$I_p = \frac{ks}{(s + a \pm j\beta)} \quad (5)$$

and the solution of (5) in the time domain is:

$$i_p = ke^{-at}\cos\beta t \quad (6).$$

Substituting the parameter values from Table 1 into (6):

$$i_p = 1.62e^{-1.045\times 10^2 t}\cos 2.73\times 10^4 t \quad (7).$$

The voltage induced in the primary winding $L_1$ is by Faraday's Law of Induction:

$$e_p = -L_1(di_p/dt) \quad (8).$$

Solving (8):

$$e_p = 296.31e^{-1.045\times 10^2 t}\sin 2.73\times 10^4 t \quad (9).$$

The voltage $e_2$ induced into secondary winding L is a function of the turns ratio of the ignition transformer multiplied by the induced primary voltage $e_p$. The turns ratio is:

$$n = \sqrt{\frac{L}{L_1}} = \sqrt{\frac{64}{6.7\times 10^{-3}}} = 98. \quad (10)$$

Multiplying equation (9) by the solution for the turns ratio in (10), and using symbolic terms:

$$e_2 = ne_p = Ke^{-at}\sin\beta t \quad (11).$$

Substituting values from Table 1 and from (10):

$$e_2 = 29\times 10^3 e^{-1.045\times 10^2 t}\sin 2.73\times 10^4 t \quad (12).$$

Figure 11:
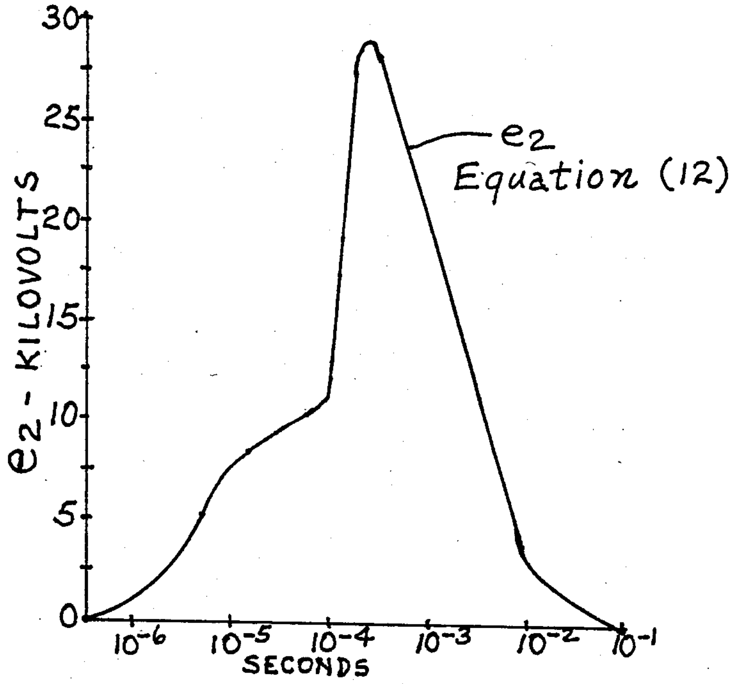
FIG. 11 is a graph of the induced voltage into the secondary winding of the ignition transformer as a function of time.

Equation (12) is represented by the graph of FIG. 11.

The Laplace transform of equation (11) in symbolic terms is:

$$E = \frac{K\beta}{(s + a \pm j\beta)} \cdot \tag{13}$$

When substituting parameter values from Table 1, equation (13) becomes:

$$E = \frac{7.92 \times 10^8}{(s + 1.045 \times 10^2 \pm j2.73 \times 10^4)} : \tag{14}$$

Equation (14) or in its symbolic form equation (13) will be used as the forcing voltage function upon the equivalent circuit of FIG. 10, such equivalent circuit being used to write the Laplace transformed equations, the solution of which results in the loop current expressions for $i_1$ and $i_2$.

To provide a better understanding Laplace transformation of integro-differential equations, the two simultaneous equations representing the loop currents $i_1$ and $i_2$ in the circuit of FIG. 10, are stated as follows:

$$e_2 = L\frac{di_1}{dt} + R_L + \frac{1}{C}\int i_1\,dt - \frac{1}{C}\int i_2\,dt \tag{15}$$

$$0 = -\frac{1}{C}\int i_1\,dt + R\,i_2 + \frac{1}{C}\int i_2\,dt \tag{16}$$

wherein $e_2$ is defined by equations (11) and (12), and the other parameters are defined in Tables 1 and 2.

The Laplace transformation operation converts equations (15) and (16) into the complex domain expressions, permitting algebraic treatment of such equations, the Laplace transformed equations are:

$$E = \left(Ls + R_L + \frac{1}{Cs}\right) I_1 - \frac{1}{Cs} I_2 \tag{17}$$

$$0 = -\frac{1}{Cs} I_1 + \left(R + \frac{1}{Cs}\right) I_2 \tag{18}$$

where $I_1$ and $I_2$ are respectively loop currents in Laplace transform notation of $i_1$ and $i_2$, and where equations (17) and (18) respectively are the Laplace transformed equations of (15) and (16).

Equations (17) and (18), are solved simultaneously for $I_1$ and $I_2$, maintaining the symbolic notations therein, as follows:

$$I_1 = \frac{E\left[\frac{s}{L} + \frac{1}{LRC}\right]}{s^2 + \left[\frac{R_L}{L} + \frac{1}{RC}\right] s + \left[\frac{1}{LC} + \frac{R_L}{LRC}\right]} \tag{19}$$

$$I_2 = \frac{E\left[\frac{1}{LRC}\right]}{s^2 + \left[\frac{R_L}{L} + \frac{1}{RC}\right] s + \left[\frac{1}{LC} + \frac{R_L}{LRC}\right]} . \tag{20}$$

The solutions sought are: $I_R = I_2$, representing the current flow through resistor R, and $I_C = I_1 - I_2$, representing the current flow through capacitor C in the complex plane.

Solving for $I_R$:

$$I_R = \frac{E\left[\frac{1}{LRC}\right]}{s^2 + \left[\frac{R_L}{L} + \frac{1}{RC}\right] s + \left[\frac{1}{LC} + \frac{R_L}{LRC}\right]} . \tag{21}$$

Substituting equation (13) for the value of E in (21):

$$I_R = \frac{K\beta\left[\frac{1}{LRC}\right]}{(s + a \pm j\beta) \times \left[s^2 + \left(\frac{R_L}{L} + \frac{1}{RC}\right) s + \left(\frac{1}{LC} + \frac{R_L}{LRC}\right)\right]} . \tag{22}$$

Substituting all parameter values in (22) except R and C:

$$I_R = \frac{12.37 \times 10^6\left[\frac{1}{RC}\right]}{(s + 1.045 \times 10^2 \pm j\,2.73 \times 10^4) \times \left[s^2 + \left(125 + \frac{1}{RC}\right) s + \left(\frac{1.56 \times 10^{-2}}{C} + \frac{125}{RC}\right)\right]} . \tag{23}$$

To solve for $I_C$, equation (20) is substracted from equation (19), resulting in:

$$I_C = \frac{E\left[\frac{1}{L}\right] s}{s^2 + \left[\frac{R_L}{L} + \frac{1}{RC}\right] s + \left[\frac{1}{LC} + \frac{R_L}{LRC}\right]} . \tag{24}$$

Substituting equation (13) for the value of E in (24):

$$I_C = \frac{K\beta\left[\frac{1}{L}\right] s}{(s + a \pm j\beta) \times \left[s^2 + \left(\frac{R_L}{L} + \frac{1}{RC}\right) s + \left(\frac{1}{LC} + \frac{R_L}{LRC}\right)\right]} . \tag{25}$$

Substituting all parameter values in (25) except R and C:

$$I_C = \frac{12.37 \times 10^6 s}{(s + 1.045 \times 10^2 \pm j\,2.73 \times 10^4) \times \left[s^2 + \left(125 + \frac{1}{RC}\right) s + \left(\frac{1.56 \times 10^{-2}}{C} + \frac{125}{RC}\right)\right]} \quad (26)$$

Equations (23) and (26) will be used to evaluate the current through resistor R and the current through capacitor C, respectively, by substituting the several combinations of R and C values therein, obtaining the roots of the quadratic term in the straight brackets of the denominator of these equations, and then finding the inverse Laplace transform of each equation using the Residue Theorem for evaluating the residues at the poles. It should be noted that the roots of this quadratic expression are synonymous with the values of the poles. Such inverse Laplace transform solutions will provide the expressions for the currents $i_R$ and $i_C$ as a function of time t, these expressions or equations being graphed in FIGS. 12 through 20.

With respect to the evaluation of equations (23) and (26), it should be kept in mind that the denominator of such equations are identical and represent the characteristics of these equations. The portion of the denominator $(s+1.045\times10^2\pm j2.73\times10^4)$ shows a complex conjugate pair of roots or poles, and comes about by virtue of the presence of the forcing function E which is the voltage function $e_2$ in the complex plane and is present in all the exemplary computations that follow.

The other bracketed quadratic expression, stated as a function of the variable s and in symbolic R and C notations, is contributed by the specific values of R and C chosen, and will represent the basis upon which criteria will be established for usable and realizable values of R and C combinations within the cable's insulation.

Figure 12:
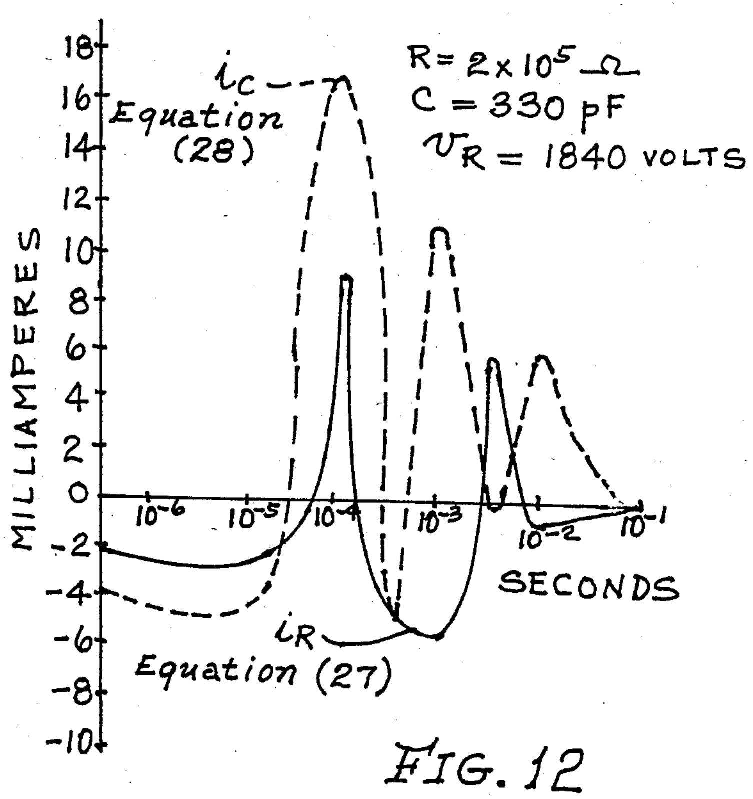
FIG. 12 is a time function graph of the computed currents through the resistor and through the capacitor within the cable, wherein the resistor is valued at $2\times10^5$ ohms and the capacitor is valued at 330 picofarads.

Referring to FIGS. 10 and 12, values for $R=2\times10^5$ ohms and C=330 picofarads are substituted in equations (23) and (26). The quadratic bearing R and C terms is evaluated, having roots or poles at $s=-4.72\times10^3$ and $s=-10.44\times10^3$, which have only real and no imaginary parts.

The equations defining the current through resistor R and capacitor C, as a function of time, were obtained by inverse Laplace transformation of equations (23) and (26) using the Residue Theorem and by evaluating the residues at the poles $s=-4.72\times10^3$ and $s=-10.44\times10^3$, and $s=-1.045\times10^2\pm j2.73\times10^4$. Such equations as graphed in FIG. 12, are:

$$i_R = 42.8 \times 10^{-3} e^{-4.72\times10^3 t} - 43.4 \times 10^{-3} e^{-10.44\times10^3 t} - 9.55 \times 10^{-3} e^{-1.045\times10^2 t} \sin 2.73 \times 10^4 t - 1.73 \times 10^{-3} e^{-1.045\times10^2 t} \cos 2.73 \times 10^4 t \quad (27)$$

$$i_C = -16.5 \times 10^{-3} e^{-4.72\times10^3 t} + 29.9 \times 10^{-3} e^{-10.44\times10^3 t} + 3.1 \times 10^{-3} e^{-1.045\times10^2 t} \sin 2.73 \times 10^4 t - 17.2 \times 10^{-3} e^{-1.045\times10^2 t} \cos 2.73 \times 10^4 t \quad (28)$$

It may be seen from the graphed equations (27) and (28) in FIG. 12, that the peak value of $i_R$ and $i_C$ waveforms are time coincident at $t=10^{-4}$ seconds, and add up to a total cable current of 26.1 milliamperes. The voltage developed across capacitor C is the same by Kirchhoff's Law as the voltage across resistor R, and the peak voltage thereacross is $v_R=1840$ volts.

Figure 13:
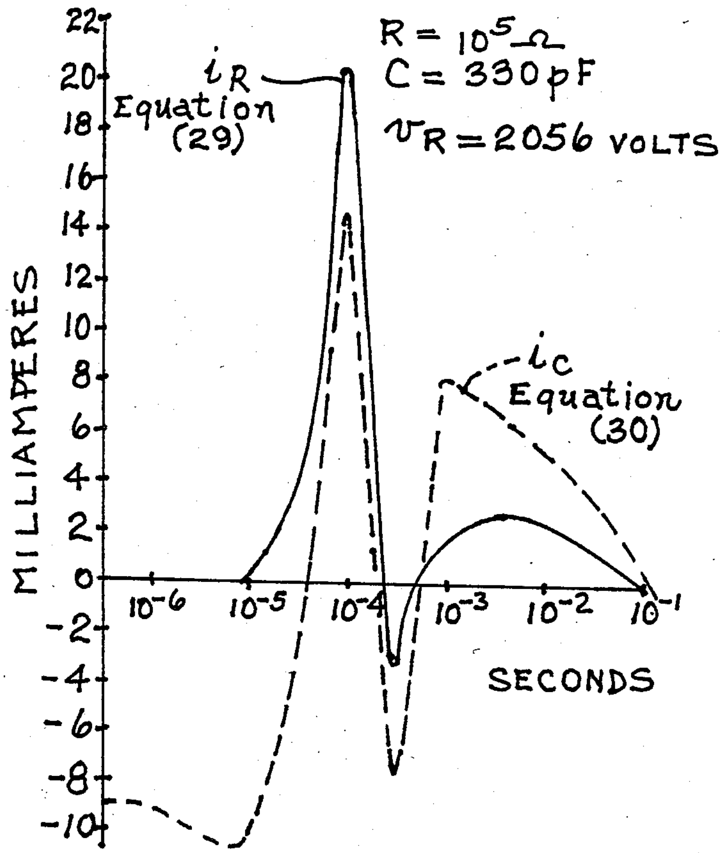
FIG. 13 is a time function graph of the computed currents through the resistor and through the capacitor within the cable, wherein the resistor is valued at $10^5$ ohms and the capacitor is valued at 330 picofarads.

Referring to FIGS. 10 and 13, the values for $R=10^5$ ohms and C=330 picofarads are substituted in equations (23) and (26). The quadratic bearing R and C terms is evaluated, having roots or poles at $s=-1.66\times10^3$ and $s=-2.86\times10^4$, which have only real and no imaginary parts.

The equations defining the current through resistor R and capacitor C as a function of time, were obtained by inverse Laplace transformation of equations (23) and (26) using the Residue Theorem by evaluating the residues at the poles $s=-1.66\times10^3$, $s=-2.86\times10^4$, $s=-1.045\times10^2\pm j2.73\times10^4$. Such equations as graphed in FIG. 13 are:

$$i_R = 18.6 \times 10^{-3} e^{-1.66\times10^3 t} - 8.89 \times 10^{-3} e^{-2.86\times10^3 t} - 8.52 \times 10^{-3} e^{-1.045\times10^2 t} \sin 2.73 \times 10^4 t - 9.61 \times 10^{-3} e^{-1.045\times10^2 t} \cos 2.73 \times 10^4 t \quad (29)$$

$$i_C = -1.03 \times 10^{-3} e^{-1.66\times10^3 t} + 8.48 \times 10^{-3} e^{-2.86\times10^4 t} - 63.5 \times 10^{-6} e^{-1.045\times10^2 t} \sin 2.73 \times 10^4 t - 16.6 \times 10^{-3} e^{-1.045\times10^2 t} \cos 2.73 \times 10^4 t \quad (30)$$

It may be seen from the graphed equations (29) and (30) in FIG. 13, that the peak value of $i_R$ and $i_C$ waveforms are time coincident at $t=10^{-4}$ seconds, and add up to a total of cable current of 35.17 milliamperes. The voltage developed across capacitor C is the same as the voltage across resistor R by virtue of Kirchhoff's Law, and the peak voltage thereacross is $v_R=2056$ volts.

Figure 14:
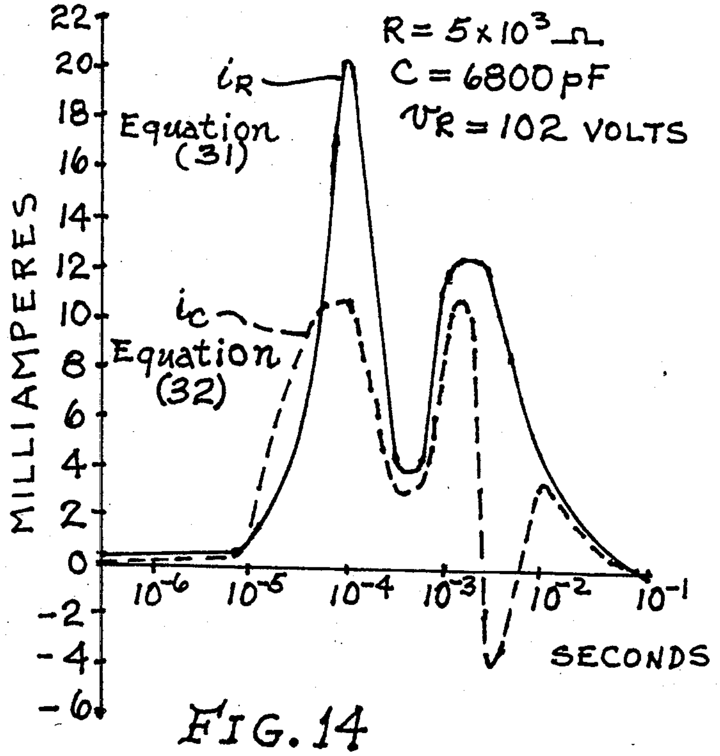
FIG. 14 is a time function graph of the computed currents through the resistor and through the capacitor within the cable, wherein the resistor is valued at $5\times10^3$ ohms and the capacitor is valued at 6800 picofarads.

Referring to FIGS. 10 and 14, the values for $R=5\times10^3$ ohms and C=6800 picofarads are substituted in equations (23) and (26). The quadratic bearing R and C terms is evaluated, having roots or poles at $s=-2\times10^2$ and $s=-2.92\times10^4$, which have only real and no imaginary parts.

The equations defining the current through resistor R and capacitor C as a function of time, were obtained by inverse Laplace transformation of equations (23) and (26) using the Residue Theorem by evaluating the residues at the poles of $s=-2\times10^2$, $s=-2.92\times10^4$, $s=-1.045\times10^2\pm j2.73\times10^4$. Such equations as graphed in FIG. 14 are:

$$i_R = 16.8 \times 10^{-3} e^{-2\times10^2 t} - 7.9 \times 10^{-3} e^{-2.92\times10^4 t} - 8.37 \times 10^{-3} e^{-1.045\times10^2 t} \sin 2.73 \times 10^4 t - 8.42 \times 10^{-3} e^{-1.045\times10^2 t} \cos 2.73 \times 10^4 t \quad (31)$$

$$i_C = -0.11 \times 10^{-3} e^{-2\times10^2 t} + 7.77 \times 10^{-3} e^{-2.92\times10^4 t} + 8.3 \times 10^{-3} e^{-1.045\times10^2 t} \sin 2.73 \times 10^4 t - 7.8 \times 10^{-3} e^{-1.045\times10^2 t} \cos 2.73 \times 10^4 t \quad (32)$$

It may be seen from the graphed equations (31) and (32) in FIG. 14, that the peak value of $i_R$ and $i_C$ waveforms are time coincident at $t=10^{-4}$ seconds, and add up to a total of cable current of 31.05 milliamperes. The voltage developed across capacitor C is the same as the voltage across resistor R by virtue of Kirchhoff's Law, and the peak voltage thereacross is $v_R=102$ volts.

Figure 15:
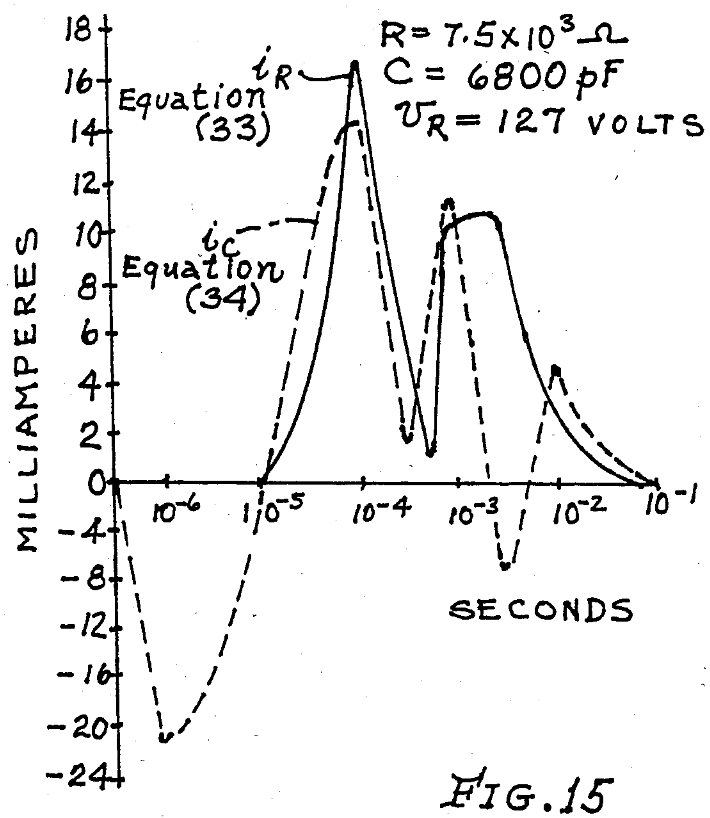
FIG. 15 is a time function graph of the computed currents through the resistor and through the capacitor within the cable, wherein the resistor is valued at $7.5\times10^3$ ohms and the capacitor is valued at 6800 picofarads.

Referring to FIGS. 10 and 15, the values for $R=7.5\times10^3$ ohms and C=6800 picofarads are substituted in equations (23) and (26). The quadratic bearing R and C terms is evaluated, having roots or poles at $s=-2.437\times10^2$ and $s=-1.948\times10^4$, which have only real and no imaginary parts.

The equations defining the current through resistor R and capacitor C as a function of time, were obtained by inverse Laplace transformation of equations (23) and

(26) using the Residue Theorem by evaluating the residues at the poles $s=-2.437\times10^2$, $s=-1.948\times10^4$, $s=-1.045\times10^2\pm j2.73\times10^4$. Such equations as graphed in FIG. 15, are:

$$i_R = 16.9 \times 10^{-3}\,e^{-2.437\times 102t} - 11.3 \times 10^{-3}\,e^{-1.948\times 104t} - 7.91 \times 10^{-3}\,e^{-1.045\times 102t}\sin 2.73 \times 10^4 t - 5.67 \times 10^{-3}\,e^{-1.045\times 102t}\cos 2.73 \times 10^4 t \quad (33)$$

$$i_C = -0.21 \times 10^{-3}\,e^{-2.437\times 102t} + 11 \times 10^{-3}\,e^{-1.948\times 104t} + 7.85 \times 10^{-3}\,e^{-1.045\times 102t}\sin 2.73 \times 10^4 t - 11 \times 10^{-3}\,e^{-1.045\times 102t}\cos 2.73 \times 10^4 t \quad (34)$$

It may be seen from the graphed equations (33) and (34) in FIG. 15, that the peak value of $i_R$ and $i_C$ waveforms are time coincident at $t \doteq 10^{-4}$ seconds, and add up to a total of cable current of 31.3 milliamperes. The voltage developed across capacitor C is the same as the voltage across resistor R by virtue of Kirchhoff's Law, and the peak voltage thereacross is $v_R=127$ volts.

Figure 16:
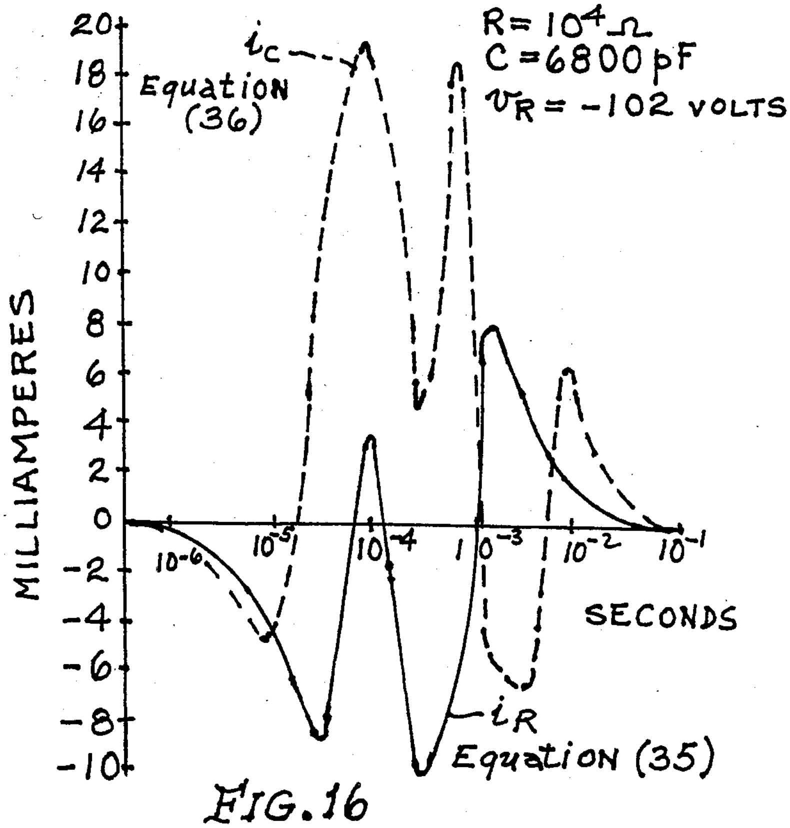
FIG. 16 is a time function graph of the computed currents through the resistor and through the capacitor within the cable, wherein the resistor is valued at $10^4$ ohms and the capacitor is valued at 6800 picofarads.

Referring to FIGS. 10 and 16, the values for $R=10^4$ ohms and C=6800 picofarads are substituted in equations (23) and (26). The quadratic bearing R and C terms is evaluated, having roots or poles at $s=-7.35\times10^5\pm j1.54\times10^4$, which are a pair of complex conjugate poles that will give rise to an additional oscillatory mode.

The equations defining the current through resistor R and capacitor C as a function of time, were obtained by inverse Laplace transformation of equations (23) and (26) using the Residue Theorem by evaluating the residues at the poles of $s=-7.35\times10^3\pm j1.54\times10^4$ and $s=-1.045\times10^2\pm j2.73\times10^4$. Such equations are graphed in FIG. 16, are:

$$i_R = 18.2 \times 10^{-3}\,e^{-7.35\times 103t}\sin 1.54 \times 10^4 t + 7.25 \times 10^{-3}\,e^{-7.35\times 102t}\cos 1.54 \times 10^4 t - 8.3 \times 10^{-3}\,e^{-1.045\times 103t}\sin 2.73 \times 10^4 t - 7.25 \times 10^{-3}\,e^{-1.045\times 102t}\cos 2.73 \times 10^4 t \quad (35)$$

$$i_C = -16.6 \times 10^{-3}\,e^{-7.35\times 103t}\sin 1.5 \times 10^{-4}\,t + 15.5 \times 10^{-3}\,e^{-7.35\times 103t}\cos 1.54 \times 10^4 t + 13.6 \times 10^{-3}\,e^{-1.045\times 102t}\sin 2.73 \times 10^4 t - 15.4 \times 10^{-3}\,e^{-1.045\times 102t}\cos 2.73 \times 10^4 t. \quad (36)$$

It may be seen from the graphs of equations (35) and (36) in FIG. 16, that the maximum value of the sum of $i_R$ and $i_C$ waveforms is 22.65 milliamperes at $t=10^{-4}$ seconds. This maximum point does not constitute the sum of the peak values of each waveform in view of the additional oscillatory mode of $1.54\times10^4$ radians per second contributed by the quadratic containing R and C terms that give rise to a complex conjugate pair of poles to create the additional oscillation mode above that contributed by the forcing function voltage feeding the cable. Such additional oscillation mode shifts the phase of $i_R$ with respect to $i_C$ waveforms so that their peaks are not coincident at the same time. Here, $i_C$ has a positive going peak at $10^{-4}$ seconds and $i_R$ a negative going peak at $5\times10^{-4}$ seconds. The voltage developed across capacitor C is the same by Kirchhoff's Law as the voltage across resistor R, and the peak voltage across R, $v_R=-102$ volts.

It should be noted that although the poles developed by the quadratic containing R and C terms are a complex conjugate pair, rather than poles with real parts only, this configuration is nevertheless acceptable in view of the low voltage across R and C, making such configuration physically realizable.

Referring to FIGS. 10 and 17, the values for $R=2.16\times10^5$ ohms and C=330 picofarads are substituted in equations (23) and (26). The quadratic bearing R and C terms is evaluated, having roots or poles at $s=(-7.01\times10^3)^2$, which constitutes a double pole pair with only real parts. Such double pole pair results when in solving for the roots of the quadratic the terms under the radical in such solution go to zero. This is considered a critical condition between oscillation and nonoscillation mode.

Solution of $i_R$ only was obtained by a use of a transform pair provided by Gardner and Barnes, Transients in Linear Systems, Volume 1, page 351, transform pair 2,618, copyright 1942 by John Wiley and Sons, New York, N.Y.

Such equation as graphed in FIG. 17 is:

$$i_R = 219\,t\,e^{-7.01\times 103t} + 3.81 \times 10^{-3}\,e^{-7.01\times 103t} + 802 \times 10^{-3}\,e^{-1.045\times 102t}\sin(2.73 \times 10^4 t - 2.65). \quad (37)$$

Within the range of time units between 0 and $10^{-1}$ seconds, the first term of equation (37) goes substantially to zero, and the evaluation leading to the graphical plot of FIG. 17 comprises the evaluation of the 2nd and 3rd term of such equation.

Such evaluation shows two high negative peak currents of −763 milliamperes at $5\times10^{-5}$ seconds and −761 milliamperes at $5\times10^{-4}$ seconds. Either of these high negative peak current values causes a peak voltage to appear across resistor R is $v_R=-164{,}800$ volts, and by Kirchhoff's Law is also the voltage across capacitor C, such high voltage destroying any physically realizable capacitor that could be included within the cable's insulation. In view of the unacceptable high voltage, it was not necessary to calculate the current through capacitor C.

Referring to FIG. 10 and 18, the values of $R=10^6$ ohms and C=20.96 picofarads are substituted in equations (23) and (26). The quadratic bearing R and C terms is evaluated, showing a pair of complex conjugate roots or poles at $s=-2.385\times10^4\pm j1.35\times10^4$ which will give rise to an additional oscillatory mode.

The equations defining the current through resistor R and capacitor C as a function of time, were obtained by inverse Laplace transformation of equations (23) and (26) using the Residue Theorem by evaluating the residues at the poles $s=-2.385\times10^4\pm j35\times10^4$ and $s=-1.045\times10^2\pm j2.73\times10^4$. Such equations as graphed in FIG. 18, are:

$$i_R = 29.09 \times 10^{-3}\,e^{-2.385\times 104t}\sin 1.35 \times 10^4 + 16.55 \times 10^{-3}\,e^{-2.385\times 104t}\cos 1.35 \times 10^4 t - 51 \times 10^{-6}\,e^{-1.045\times 102t}\sin 2.73 \times 10^4 t - 16.59 \times 10^{-3}\,e^{-1.045\times 102t}\cos 2.73 \times 10^4 t \quad (38)$$

$$i_C = -19.3 \times 10^{-3}\,e^{-2.385\times 104t}\sin 1.35 \times 10^4 t - 52.9 \times 10^{-6}\,e^{-2.385\times 104t}\cos 1.35 \times 10^4 t + 9.49 \times 10^{-3}\,e^{-1.045\times 102t}\sin 2.73 \times 10^4 t + 7.6 \times 10^{-6}\,e^{-1.045\times 102t}\cos 2.73 \times 10^4 t. \quad (39)$$

It may be seen from the graphical plot of equations (38) and (39) in FIG. 18, that the maximum current flow of the sum of $i_R$ and $i_C$ is 19.91 milliamperes at $10^{-4}$ seconds. This maximum point does not constitute the sum of the peak values of the waveforms in view of the additional oscillatory mode of $1.35\times10^4$ radians per second contributed by the quadratic containing R and C terms that give rise to a complex conjugate pair of poles of $s=-2.385\times10^4\pm j1.35\times10^4$. Such oscillation mode shifts the phase of $i_R$ with respect to $i_C$ waveform so that their peaks are not coincident at the same time. The voltage developed across capacitor C is the same by Kirchhoff's Law as the voltage across resistor R, and the peak voltage across R is $v_R=17{,}900$ volts. Such high voltage would be considered as being sufficient to destroy any physically realizable capacitor that may be included within the cable's insulation for very short length lumped parameter cables.

C was chosen at 20.96 picofarads for this model, since this is the value of capacity that resonates inductor L at the forcing function frequency of $e_2$ at $2.73\times10^4$ radians per second. Such selection was based on the fact that this capacitance value, absent resistor R, would have created the largest ignition current possible and consequently the largest voltage across such capacitor, establishing a 20,000 volt limit on distributed parameter cables.

It should be borne in mind, that even with the resonating capacitor value of 20.96 picofarads, the use of a resistor thereacross of value less than $10^6$ ohms, will reduce the voltage across the capacitor to acceptable levels below 17,900 volts. Had a resistor of $R=8\times10^5$ ohms been chosen instead of $10^6$ ohms, the poles contributed would have been real, and the additional oscillation mode would not be present as well as the voltage across capacitor C would be substantially reduced to an acceptable level.

Discussion of the graph in FIG. 19, where no resistor R is used, and only capacitor C of 20.96 picofarads is present, will verify the high current and large destructive voltage present under such conditions across capacitor C, wherein C resonates with L at $2.73\times10^4$ radians per second.

Referring to FIG. 19, the equivalent circuit of FIG. 10 is modified by eliminating resistor R, since only C is present within the cable's insulation. This model is established in support of the model described in conjunction with FIG. 18 and graphs of the ignition currents depicted therein. The model of FIG. 18, with its resistor R, will reduce the voltage developed across capacitor C as compared with the instant model.

A single equation for the current was based on this model without resistor R and with capacitor C of 20.96 picofarads. As previously stated, the value of this capacitor was selected so it would resonate with inductor L at the forcing voltage $e_2$ frequency of $2.73\times10^4$ radians per second.

It would appear from these calculations that a resonating capacitor without a shunt resistor is undesirable, and hence in FIGS. 1-8 structures, values of capacitors are selected that are not in resonance with the secondary winding L of the ignition transformer at the forcing voltage frequency. Accordingly, capacitor values in the order of 100 picofarads, physically realizable, will not develop destructively high voltages thereacross, even in the absence of a shunt resistor.

The quadratic containing R and C terms in the denominator of the ignition current function in the complex plane exhibits roots or poles at $s=-0.625\times10^2\pm j2.73\times10^4$ in the instant model, which constitute a complex conjugate pair of poles bringing about an additional oscillatory mode at the same frequency as that of the forming voltage $e_2$ which itself exhibits a pair of complex conjugate poles at $s=-1.045\times10^2\pm j2.73\times10^4$. The solution of the ignition current waveform as graphed in FIG. 19 and representing the current through capacitor C is:

$$i_C = 5.4\,e^{-0.625\times10^2t}\sin 2.73\times10^4t + 16.5\times10^{-3}\,e^{-0.625\times10^2t}\cos 2.73\times10^4t - 5.4\,e^{-1.045\times10^2t}\sin 2.73\times10^4t - 16.5\times10^{-3}\,e^{-1.045\times10^2t}\cos 2.73\times10^4t. \quad (40)$$

A maximum negative peak current of $-740$ milliamperes was exhibited through capacitor C at $t=5\times10^{-3}$ seconds. The voltage stress across capacitor C was calculated to be of destructive level of $v_C=-1{,}295{,}000$ volts.

Referring to FIG. 20, the equivalent circuit of FIG. 10 is modified by eliminating capacitor C, since only resistor R is present within the cable's insulation in this model. This model was established only for comparing it with another model of FIG. 13 having the same valued resistor and a capacitor valued at 330 picofarads, so that the energy increase utilizing a capacitor in addition the the resistor, may be approximated.

A single equation for the current was based on the model without capacitor C for a resistor $R=10^5$ ohms. This model without the capacitor exhibited a single real pole due to the resistor at $s=-1.69\times10^3$, the other pair of complex conjugate poles due to the forcing voltage $e_2$ being at $s=-1.045\times10^2\pm j2.73\times10^4$. The equation is graphically shown in FIG. 20 and solved by the Residue Theorem, is:

$$i_R = 16.5\times10^{-3}\,e^{-1.69\times10^3t} + 0.96\times10^{-3}\,e^{-1.045\times10^2t}\sin 2.73\times10^4t - 16.5\times10^{-3}\,e^{-1.045\times10^2t}\cos 2.73\times10^4t. \quad (41)$$

It may be seen from equation (41) and FIG. 20, that the peak value of the current through R is 23.9 milliamperes at $10^{-4}$ seconds. As compared with the model of FIG. 13 having the same resistor and a capacitor of 330 picofarads which yielded a total current of 35.17 milliamperes, the model with the capacitor had 47% greater current flow than the model without the capacitor, and hence could be expected to produce a correspondingly greater energy level to enhance fuel ignition.

Since energy is a function of power and time, such greater energy level may be approximated using the same time units and the same resistor values. The improved energy level can then be computed as the ratio of the current squared of the FIG. 13 situation divided by the current squared of the FIG. 20 situation, which is $(35.17)^2/(23.19)^2=2.3$.

From the foregoing discussion and model analysis, the following criteria may be stated:

Criteria 1: Any parallel combination of resistor R and capacitor C may be used within the cable having parameters that contribute only first order poles with only real parts in the complex plane of the ignition current expression. (First order poles excludes the undesirable condition of multiple order poles of the FIG. 17 situation which created a high destructive voltage across C).

Criteria 2: Any value of capacitor C may be used within the cable's insulation without a shunt resistor, except a value which resonates the secondary winding inductance of the ignition transformer to the forcing voltage frequency. (A resonating capacitor without a shunt resistor will result in a destructive voltage across the capacitor as illustrated in the FIG. 19 situation).

Criteria 3: Any parallel combination of resistor R and capacitor C may be used where the parameter relationship of:

$$\left[\frac{R_L}{L} + \frac{1}{RC}\right]^2 > 4\left[\frac{1}{LC} + \frac{R_L}{LRC}\right]$$

is observed, for the expression of the denominator of ignition current in the complex plane containing R and C parameters. (Note that this criteria is substantially the same in effect as Criteria 1, differently stated).

Criteria 4: Any parallel combination of resistor R and capacitor C may be used when their parameter values are such as to limit a voltage thereacross to a peak value of less than 20,000 volts. (Cables with distributed capacitance and resistance of physically realizable dimensions having voltage ratings of less than 20,000 volts may be readily fabricated).

I claim:

1. An ignition current transmission cable, said cable having a body comprising electrical insulation, characterized by:

a capacitive element embedded in said electrical insulation; and a resistive element embedded in said electrical insulation, said resistive element being connected in parallel with the capacitive element, said capacitive and resistive elements constituting means for passing ignition current through the cable.

2. The cable as stated in claim 1, wherein said capacitive element is of distributed parameter structure.

3. The cable as stated in claim 1, wherein said resistive element is of distributed parameter structure.

4. The cable as stated in claim 1, wherein said capacitive element is of lumped parameter structure.

5. The cable as stated in claim 1, wherein said resistive element is of lumped parameter structure.

6. The cable as stated in claim 1, wherein said capacitive element produces electric and magnetic field components that cancel each other.

7. The cable as stated in claim 1, wherein said capacitive element constitutes a first electrically conductive member and a second electrically conductive member insulated from the first member, said element having a first end and a second end opposite from the first end, said first member being connective at the first end and unterminated at the second end, said second member being connective at the second end and unterminated at the first end.

8. The cable as stated in claim 7, wherein said first and second members are transposed.

9. The cable as claimed in claim 7, wherein said first and second members are parallel to each other.

10. The cable as stated in claim 7, wherein said first member is substantially straight and said second member is circumjacent at least a portion of the first member.

11. The cable as stated in claim 1, wherein said capacitive element constitutes a transposed pair of electrically insulated wires, said transposed pair having a first end and a second end opposite to the first end, one of said transposed pair being electrically connective at the first end and non-connective at the second end, the other of said transposed pair being electrically connective at the second end and non-connective at the first end.

12. The cable as stated in claim 1, wherein said capacitive element constitutes an electrically conductive electrode and a winding circumjacent to and insulated from said electrode, said cable having a first end and a second end opposite from the first end, said electrode being connective at the first end and unterminated at the second end, said winding being connective at the second end and unterminated at the first end.

13. A transmission cable for passing ignition current in an ignition system, said cable having a body comprising electrical insulation, characterized by:

resistive means, embedded in said insulation, for passing a portion of said ignition current; and capacitive means, embedded in said insulation and parallel with the resistive means, said capactive means having parameter values that preclude additional frequencies in said ignition current other than those normally present in the absence of said capacitive means.

14. The cable as stated in claim 13, wherein said capacitive means constitutes a distributed parameter structure.

15. The cable as stated in claim 13, wherein said resistive means constitutes a distributed parameter structure.

16. The cable as stated in claim 13, wherein said capacitive means constitutes a first electrically conductive member and a second electrically conductive member insulated from the first member, said capacitive means having a first end and a second end opposite from the first end, said first member being connected at the first end to one end of the resistive means and unterminated at the second end, said second member being connected at the second end to the other end of the resistive means and unterminated at the first end.

17. The cable as stated in claim 16, wherein said first and second members are transposed.

18. The cable as stated in claim 16, wherein said first and second members are parallel to each other.

19. The cable as stated in claim 16, wherein said first member is substantially straight and said second member is circumjacent at least a portion of the first member.

20. The cable as stated in claim 13, wherein said capacitive means constitutes a transposed pair of electrically insulated wires, said transposed pair having a first end and a second end opposite to the first end, one of said transposed pair being electrically connected to one end of the resistive means at the first end and unterminated at the second end, the other of said transposed pair being electrically connected to the other end of the resistive means at the second end and unterminated at the first end.

21. The cable as stated in claim 13, wherein said capacitive means constitutes an electrically conductive electrode and a winding circumjacent to and insulated from said electrode, said cable having a first end and a second end opposite from the first end, said electrode being connected to one end of the resistive means at the first end and unterminated at the second end, said winding being connected to the other end of the resistive means at the second end and unterminated at the first end.

22. A transmission cable for passing ignition current, said cable having a body of electrical insulation, characterized by:

first means, embedded in said insulation, for passing a first portion of said ignition current; and second means, in parallel with the first means within said insulation, for passing a second portion of said ignition current, said second portion having a peak value that is substantially time coincident with a peak value of the first portion.

23. The cable as stated in claim 22, wherein said second means constitutes a distributed capacity structure.

24. The cable as stated in claim 22, wherein said first means constitutes a distributed resistive structure.

25. The cable as stated in claim 22, wherein said second means constitutes a first electrically conductive member and a second electrically conductive member insulated from the first member, said second means having a first end and a second end opposite from the first end, said first member being connected at the first end to one end of the first means and unterminated at the second end, said second member being connected at the second end to the other end of the first means and unterminated at the first end.

26. The cable as stated in claim 25, wherein said first and second members are transposed.

27. The cable as stated in claim 25, wherein said first and second members are parallel to each other.

28. The cable as stated in claim 25, wherein said first member is substantially straight and said second member is circumjacent at least a portion of the first member.

29. The cable as stated in claim 22, wherein said second means constitutes a transposed pair of electrically insulated wires, said transposed pair having a first end and a second end opposite to the first end, one of said transposed pair being electrically connected to one end of the first means at the first end and unterminated at the second end, the other of said transposed pair being electrically connected to the other end of the first means at the second end and unterminated at the first end.

30. The cable as stated in claim 22, wherein said second means constitutes an electrically conductive electrode and a winding circumjacent to and insulated from said electrode, said cable having a first end and a second end opposite from the first end, said electrode being connected to one end of the first means at the first end and unterminated at the second end, said winding being connected to the other end of the first means at the second end and unterminated at the first end.

* * * * *